(12) United States Patent
Pang

(10) Patent No.: US 7,799,626 B2
(45) Date of Patent: Sep. 21, 2010

(54) LATERAL DMOS DEVICE STRUCTURE AND FABRICATION METHOD THEREFOR

(75) Inventor: Sung-Man Pang, Gwangmyeong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 35 days.

(21) Appl. No.: 12/133,409

(22) Filed: Jun. 5, 2008

(65) Prior Publication Data

US 2008/0303088 A1      Dec. 11, 2008

(30) Foreign Application Priority Data

Jun. 8, 2007     (KR)     ............ 10-2007-0055861

(51) Int. Cl.
*H01L 21/336*     (2006.01)
*H01L 21/8234*    (2006.01)

(52) U.S. Cl. .............. 438/197; 438/167; 438/505; 257/E21.042; 257/E21.248; 257/E21.351; 257/E21.352; 257/E21.421; 257/E21.32

(58) Field of Classification Search .......... 438/167, 438/197, 199, 174, 257, 289, 301, 311, 505, 438/954; 257/E21.042, 248, 351, 352, 421, 257/32
See application file for complete search history.

(56) References Cited

U.S. PATENT DOCUMENTS

| | | | | | |
|---|---|---|---|---|---|
| 5,369,045 | A | * | 11/1994 | Ng et al. | 438/197 |
| 5,925,910 | A | * | 7/1999 | Menegoli | 257/335 |
| 6,133,107 | A | * | 10/2000 | Menegoli | 438/306 |
| 7,453,119 | B2 | * | 11/2008 | Bhalla et al. | 257/330 |

* cited by examiner

*Primary Examiner*—David Nhu
(74) *Attorney, Agent, or Firm*—Sherr & Vaughn, PLLC

(57) ABSTRACT

A lateral DMOS device and a fabrication method therefor that may include forming a second conductive type well in a first conductive type semiconductor substrate and forming a Schottky contact in contact with the second conductive type well in a Schottky diode region, thereby preventing breakdown of the device due to high voltage.

12 Claims, 11 Drawing Sheets

TRANSISTOR REGION(A-A')

SCHOTTKY DIODE REGION(C-C')

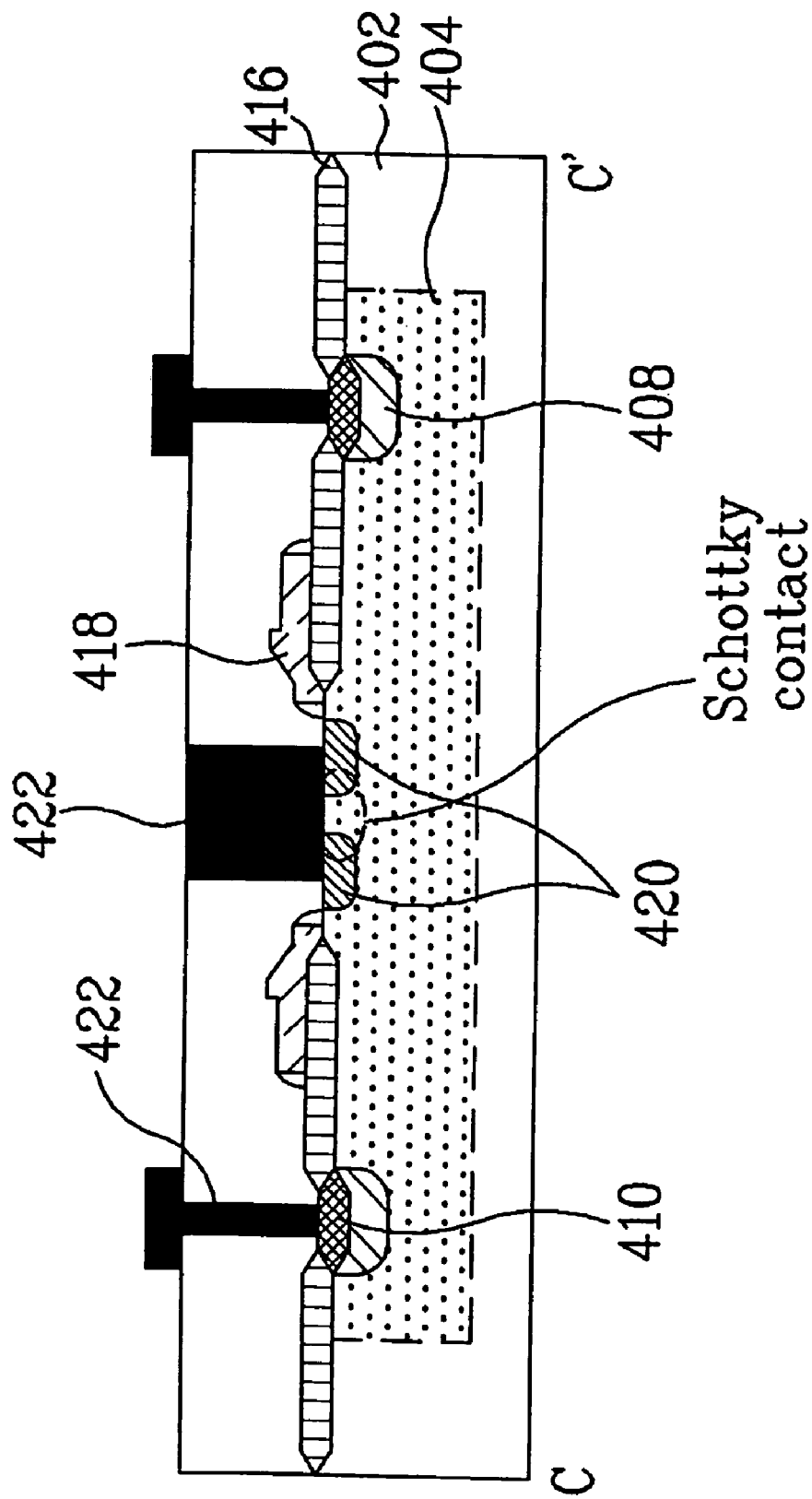

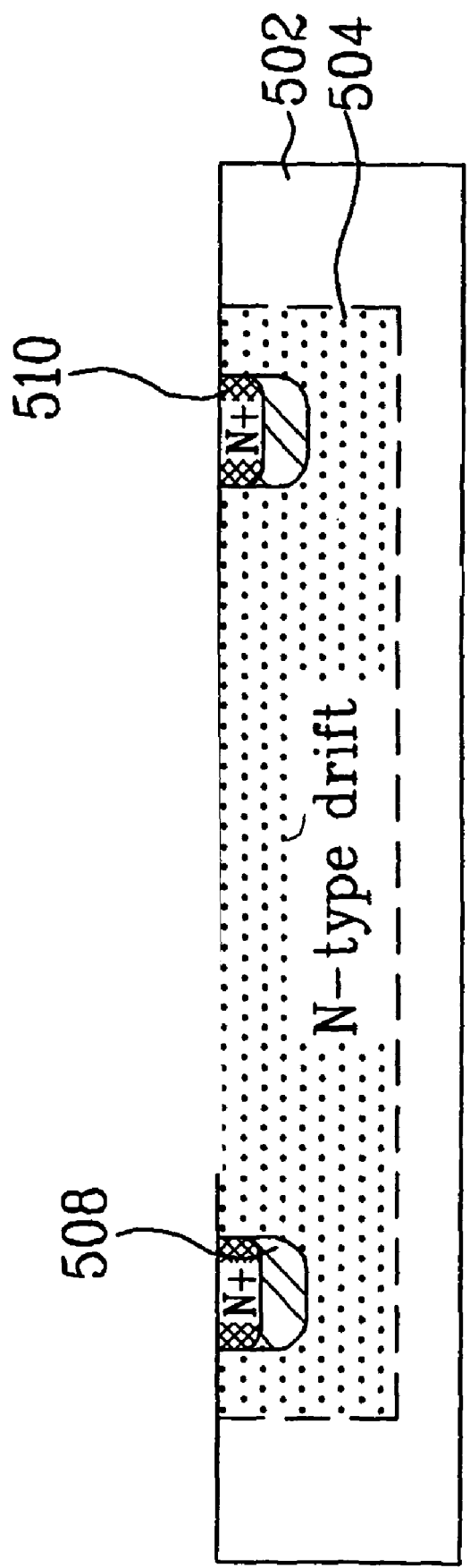

TRANSISTOR REGION(A-A')

SCHOTTKY DIODE REGION(C-C')

TRANSISTOR REGION(A–A')

SCHOTTKY DIODE REGION(C–C')

LATERAL DMOS DEVICE STRUCTURE AND FABRICATION METHOD THEREFOR

The present application claims priority under 35 U.S.C. 119 to Korean Patent Application No. 10-2007-0055861 (filed on Jun. 8, 2007), which is hereby incorporated by reference in its entirety.

BACKGROUND

Since a generally used power MOS Field Effect Transistor (hereinafter, referred to as 'MOSFET') has input impedance higher than a bipolar transistor, it has a large power gain and a simple driving circuit. Also, since the power MOSFET is a uni-polar device, it does not have time delay generated due to accumulation or re-combination by minority carriers while the device is turned off. Therefore, the application of the power MOSFET has gradually been spread to a switching mode power supply, a lamp ballast, and a motor driving circuit. Usually, as such a power MOSFET, a double diffused MOSFET (DMOSFET) structure using a planar diffusion technology is widely used. A representative LDMOS transistor of the DMOSFET structure is disclosed in U.S. Pat. No. 4,300,150 issued to Sel Colak on Nov. 10, 1981. Also, technologies integrating the LDMOS transistor with a CMOS transistor and a bipolar transistor are reported in "A 1200 BiCMOS Technology and Its Application," ISPSD 1991, pp. 322-327 by Vladimir Rumennik and "Recent Advances in Power Integrated Circuits with High Level Integration," ISPSD 1994, pp. 343-348 by Stephen P. Robb.

Since a LDMOS device has a simple structure, it is very suitable for application to a VLSI process. However, it has been thought that LDMOS devices are poor in characteristics than a vertical DMOS (VDMOS) so that it has not sufficiently been spotlighted. While a reduced surface field (RESURF) LDMOS device has excellent on-resistance ($R_{sp}$), its structure is applicable to only devices of which source is grounded, and is very complicated and difficult in application.

Figure 1:
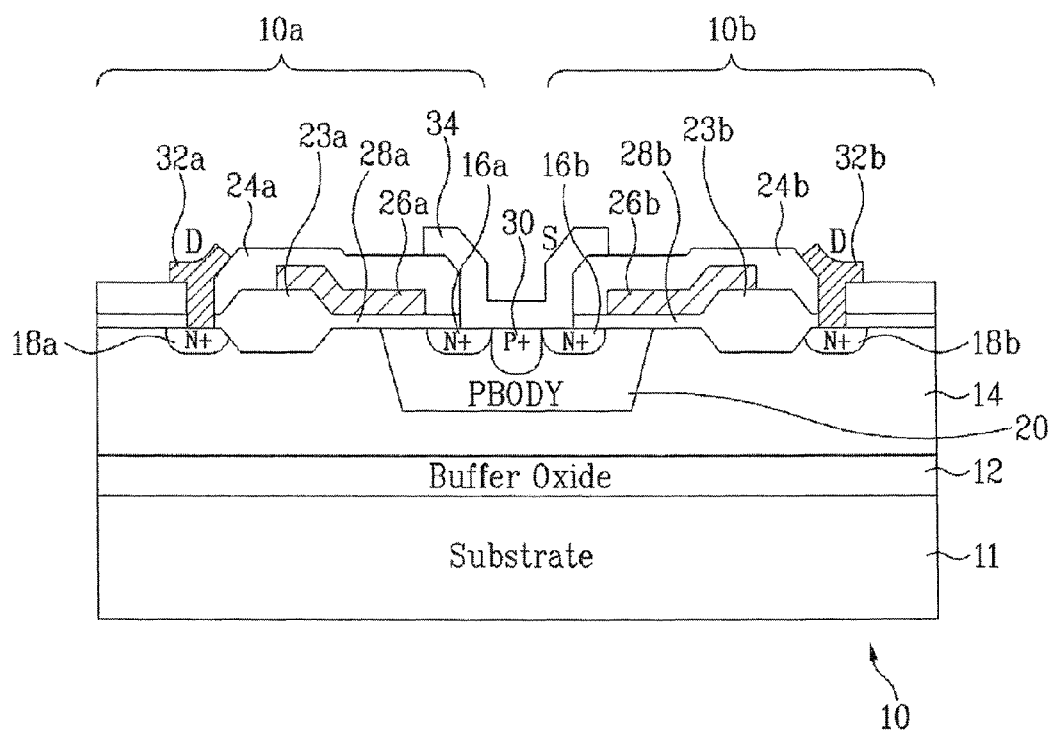

As illustrated in example FIG. 1, LDMOS transistor device 10 is provided including first and second LDMOS transistors 10a and 10b and source region 16a and drain region 18a. LDMOS transistor 10a can be formed on and/or over silicon substrate 11 having a silicon-on-insulator (SOI) structure, buffer oxide 12 and semiconductor layer 14 covering silicon substrate 11. Herein, reference numbers 24a and 24b indicate insulating layers. N-type doped source region 16a is formed in P-type doped well region 20 such as P-type body. P-type body 20 may extend through the semiconductor layer 14 to an upper surface of buffer oxide 12 or exist only within the semiconductor layer 14. Drain region 18a is provided adjacent on one side of field insulating region 23a. Field insulating region 23a can be formed of a field oxide such as a thermally grown silicon oxide. Gate electrode 26a is formed on and/or over a surface of semiconductor layer 14 and extend from an upper surface of a portion of source region 16a to an upper surface of field insulating region 23a. Gate electrode 26a is composed of polysilicon doped with impurities. Gate electrode 26a is isolated from the surface of semiconductor 14 by gate insulating layer 28a. Gate insulating layer 28a can be formed of an oxide, or a nitride, or a compound thereof (i.e., a stacked NO or ONO layer). A sidewall region may be formed on and/or over a sidewall of gate electrode 26a. The sidewall region may be formed of an oxide such as a silicon oxide or a nitride such as a silicon nitride. High concentration doped body region 30 formed in P-type body 20 to have a good contact against P-type body 20. Body region 30 is doped at a concentration higher than P-type body 20. Source/drain contacts 32a and 34 are also included in transistor device 10a in order to electrically couple source/drain regions 16a and 18a to other components in a circuit via insulating layer 24a. Contact 34 is used for source regions 16a and 16b of both transistors 10a and 10b. Such a representative structure is disclosed in U.S. Pat. No. 5,369,045 to Wia T. Ng. et al.

Figure 2:
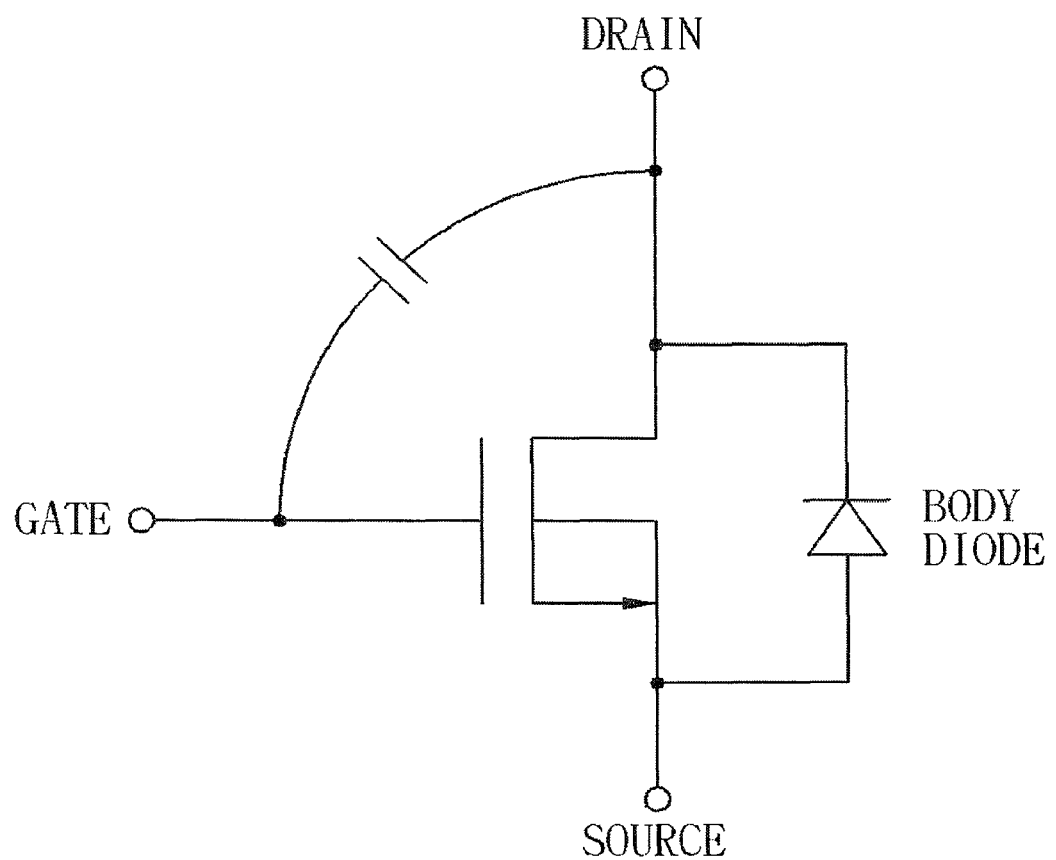

As illustrated in example FIG. 2, a LDMOS device includes a transistor device, a body diode, and parasitic capacitance between a drain and a gate. The body diode is a diode created by junction of P-type body 20 and N-type semiconductor layer 14 as illustrated in example FIG. 1, and is intrinsic in the LDMOS. Such an LDMOS device should withstand a high voltage between a drain and a source in an off state and rapidly flow a large current between the drain and the source in an on state. Breakdown of the device occurs according to the high voltage between the drain and the source in the vicinity of a junction of gate insulating layer 28a or P-type body 20 and source regions 16a and 16b. In a case where the high voltage is continuously applied to gate insulating layer 28a, stress is accumulated on gate insulating layer 28a so that gate insulating layer 28a is broken down. Therefore, in a case where gate insulating layer 28a is formed relatively thick in order to improve its breakdown voltage characteristics, it acts as a factor deteriorating operation characteristics of the device due to the increase of threshold voltage.

Figure 3:
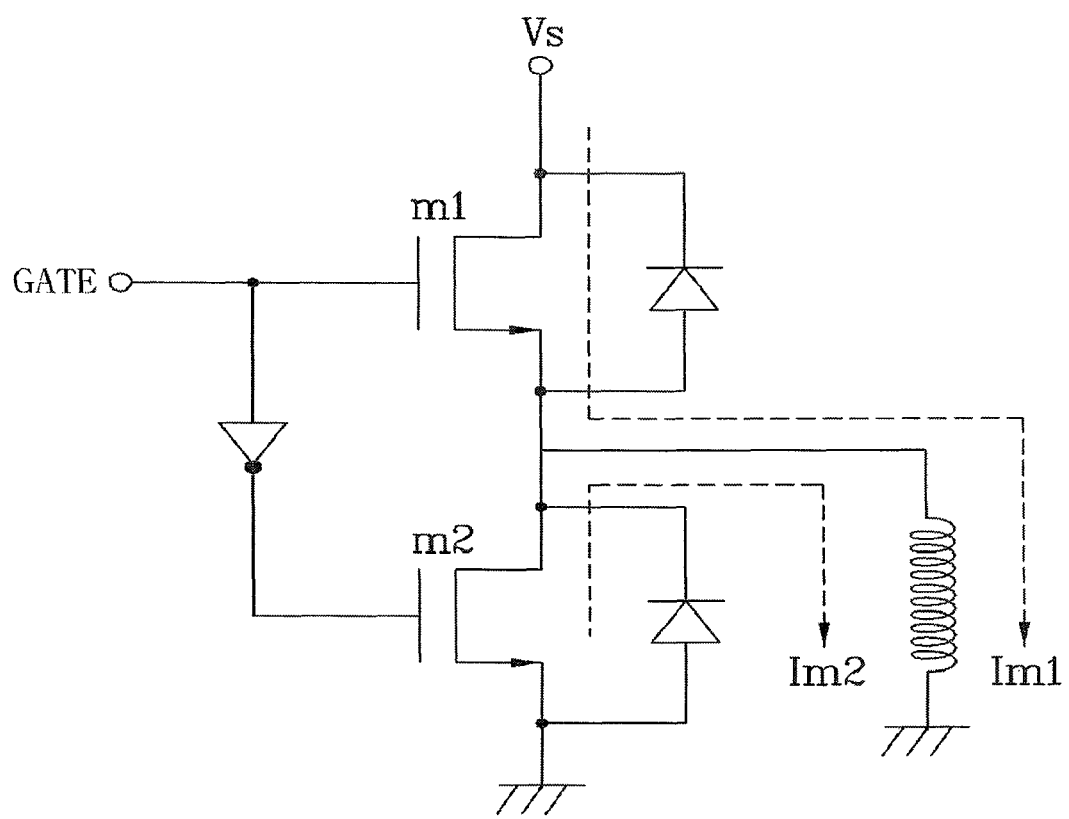

As illustrated in example FIG. 3, in a case of driving inductor load through a push-pull structure or a bridge structure having DMOS devices m1 and m2, there is a forward conducting operation region of the body diode such as $I_{m2}$, together with a backward conducting operation region of the body diode such as $I_{m1}$ in example FIG. 2. If the current of the body diode is large, minority carriers are accumulated, diode off is delayed, and operation of a parasitic bipolar junction transistor is caused.

SUMMARY

Embodiments relate to a lateral DMOS device used for power or high voltage and which includes a Schottky diode to allow breakdown of the device due to a high voltage generated in the Schottky diode, and perform a role of flowing a considerable amount of current in the Schottky diode instead of a body diode in a forward conducting operation region, thereby increasing operation speed and stability of the device.

Embodiments relate to a method of forming a lateral DMOS device using a bipolar CMOS DMOS (BCD) process, thereby integrating the power device and preventing a phenomenon caused by operation of a parasitic bipolar transistor junction by a simple process.

Embodiments relate to a method of fabricating a lateral DMOS device having a transistor region, a Schottky diode region, and a field region, the method including at least one of the following steps: forming a second conductive type well on and/or over a first conductive type semiconductor substrate; and then forming a Schottky contact in contact with the second conductive type well in a Schottky diode region.

Embodiments relate to a lateral DMOS device having a transistor region, a Schottky diode region, and a field region, the lateral DMOS device including at least one of the following: a second conductive type well formed on and/or over a first conductive type semiconductor substrate; and a Schottky contact formed in contact with the second conductive type well in the Schottky diode region.

Embodiments relate to a method of fabricating a lateral DMOS device having a transistor region, a Schottky diode region, and a field region, the method including at least one of the following steps: forming in the transistor region and the Schottky diode region an N-type drift region in a P-type silicon substrate; and then forming in the transistor region and the Schottky diode region a drain region in the N-type drift region including an N-type impurity layer and an N+ type drain formed on the N-type impurity layer; and then forming in the transistor region a P-type body in the N-type drift region spaced apart from the drain region; and then forming in the transistor region a high concentration doped P+ type impurity layer in the P-type body and high concentration doped N+ type sources surrounding the P+ type impurity layer; and then forming in the Schottky diode region P+ type guard rings in the N-type drift region; and then forming field oxide layers in the transistor region, the Schottky diode region and the field region; and then forming a gate in the transistor region and the Schottky diode region; and then forming in the Schottky diode region a contact in contact with the N-type drift region.

DRAWINGS

Example FIGS. 1 to 3 illustrate a DMOS device and a current path of a push-pull output stage having of a lateral DMOS device.

Example FIGS. 4 to 5 illustrate a lateral DMOS device having a Schottky diode and a method of fabricating the same, in accordance with embodiments.

DESCRIPTION

In accordance with embodiments, although a first conductive type and a second conductive type are described as a P-type and an N type, respectively herein, the first conductive type and the second conductive type may be an N-type and a P-type, respectively.

Figure 4A:
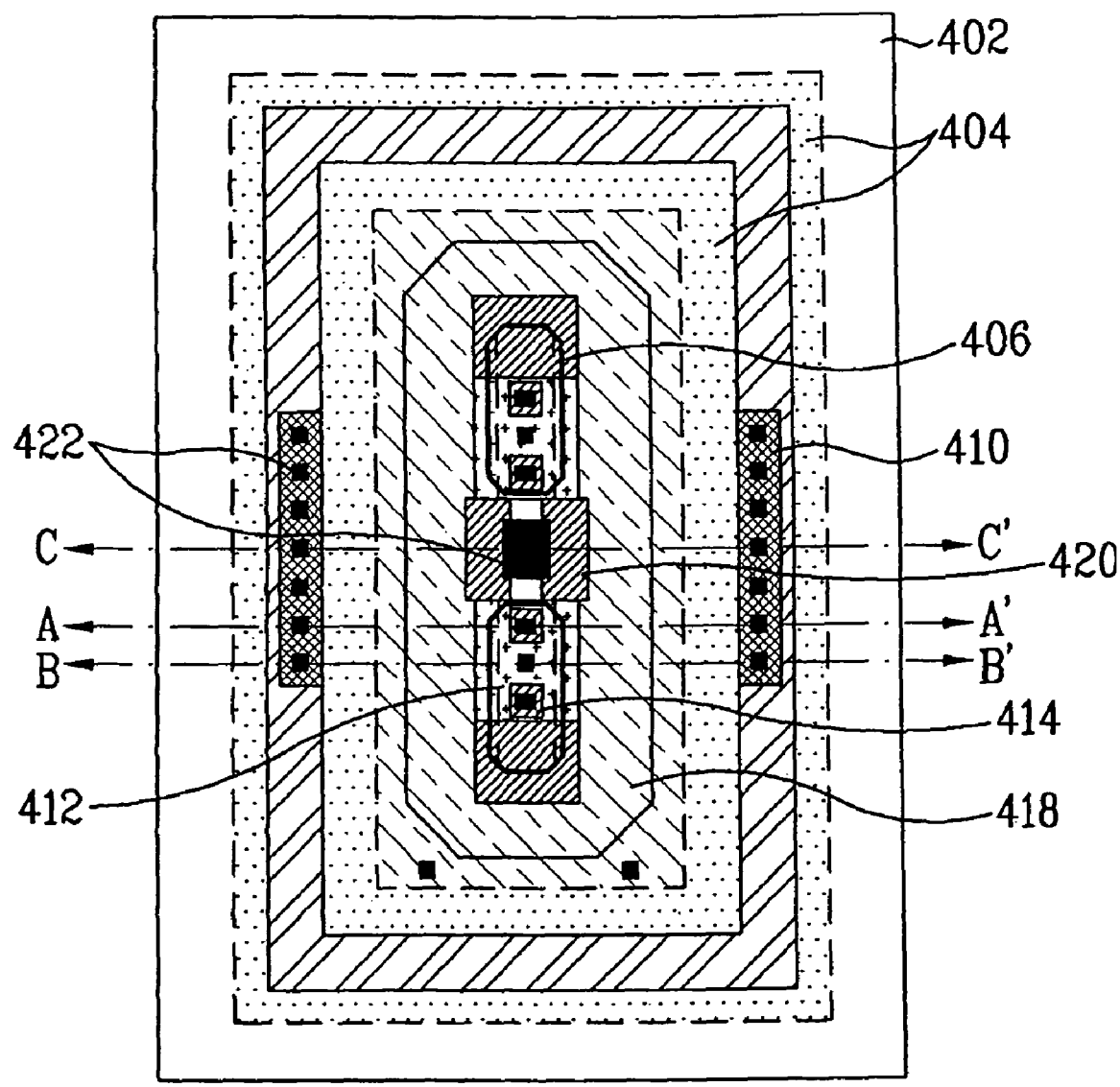

As illustrated in example FIG. 4A, an LDMOS device having a Schottky diode in accordance with embodiments may include P-type silicon substrate (or, P-type epitaxial layer) 402, N-type drift region 404 in an N-type well form, P-type body 406, N+ type drain 410, N+ type source 412, P+ impurity layer 414, gate 418 including a gate electrode and a gate insulating layer, P+ type guard ring 420 and metal contact 422. Since the structure illustrated in example FIG. 4A is a stacked structure, a lower layer structure may be hidden by an upper layer structure. Herein, the LDMOS device may be divided into transistor region (A-A'), body diode region (B-B') and Schottky diode region (C-C'). Transistor region (A-A') and body diode region (B-B') may be formed with a portion in charge of a transistor function and a portion in charge of operation of a body diode, such that the body diode passes forward current not to drop over-voltage between the source and the drain when the source undesiredly has voltage higher than the drain. Also, Schottky region (C-C') may be a portion in which a Schottky contact including metal contact 422 and N-type drift region 404 in contact with a lower of metal contact 422 is formed using a fact that a Schottky junction formed of a silicon semiconductor substrate and a metal layer has rectifying action by a barrier thereof.

Figure 4B:
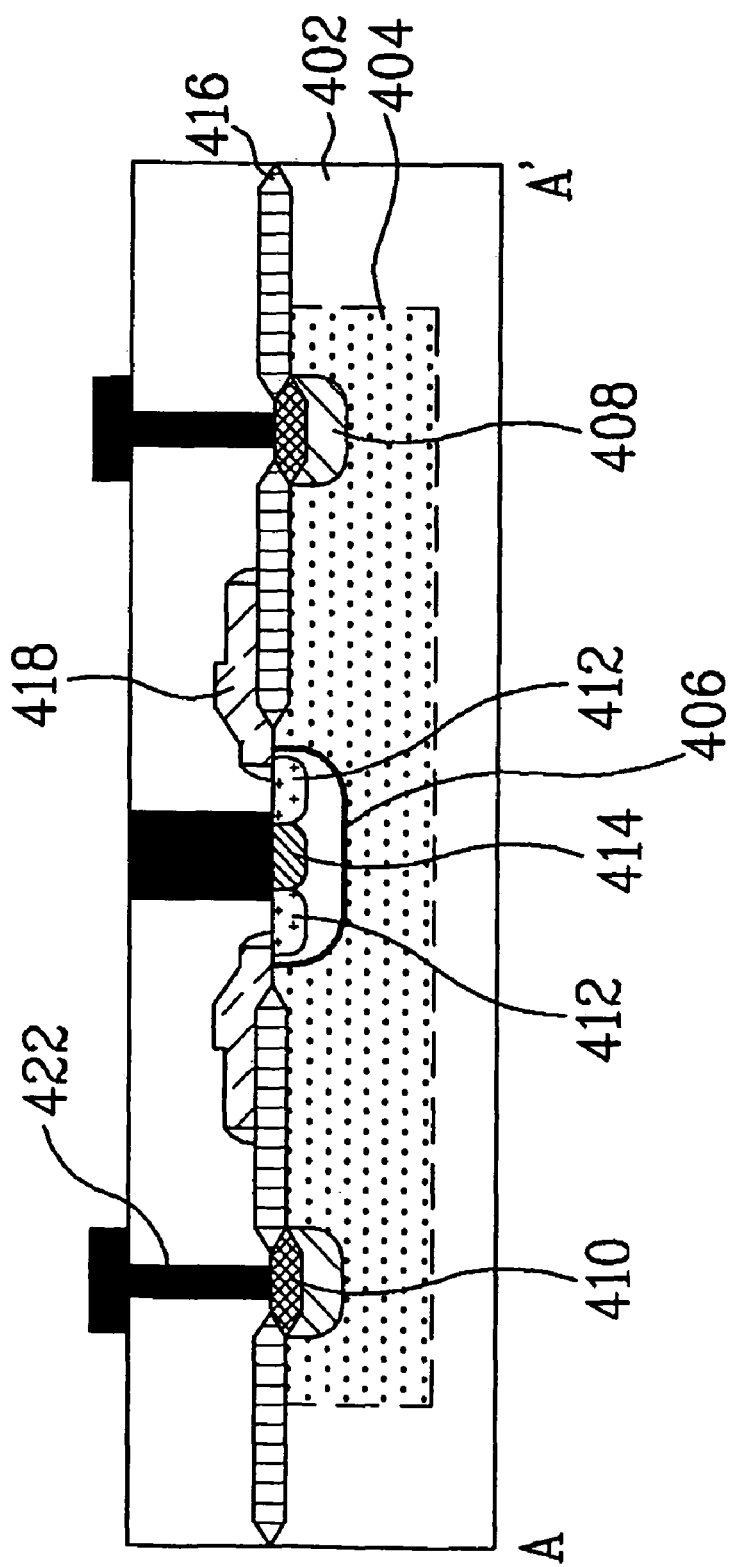

Example FIG. 4B illustrates a cross-sectional view of transistor region (A-A') illustrated in example FIG. 4A and includes P-type silicon substrate 402 into which is formed N-type drift region 404. P-type body 406 and a drain region including N-type impurity layer 408 and N-type drain 410 may be formed in N-type drift region 404. N+ type sources 412 and P+ type impurity layer 414 may be formed on and/or over P-type body 406. Field oxide 416 may be formed on substrate 402 and N-type drift region 404 and gate 418 may be formed on and/or over P-type body 406 and contacting field oxide 416 and N+ type source region 412. A channel region is formed at the vicinity of a surface of P-type body 406 extending between a contact surface of P-type body 406 and N-type drift region 404 and N+ type source 412 according to bias voltage applied to gate 418. High concentration doped P+ type impurity layer 414 may be formed on and/or over P-type body 406 to have a good contact against P type body 406.

Figure 4C:
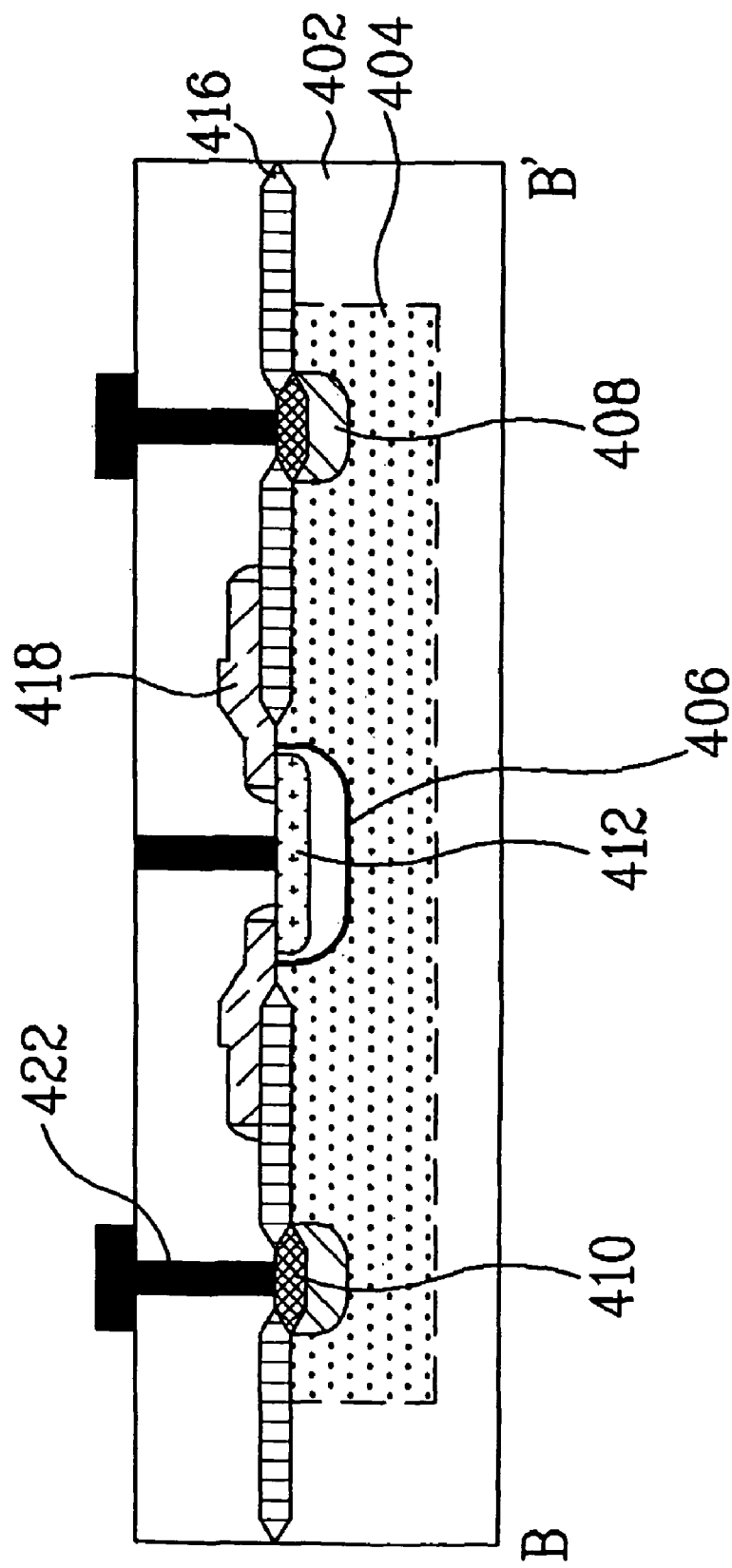

Example FIG. 4C illustrates a cross-sectional view of body diode region (B-B') illustrated in example FIG. 4A. Body diode region (B-B') may be formed with a portion in charge of a role of the body diode. Also, the body diode may be formed having a structure in which P-type body 406 and N-type drift region 404 are in contact with each other. Since transistor region (A-A') also has a structure which includes a body diode, the body diode may be formed in body diode region (B-B') as well as transistor region A-A'. The structure of body diode region (B-B') is different from that of transistor region (A-A') in that P+ type impurity layer 414 does not exist and only N-type source 412 portion exists in P-type body 406. N-type drift region 404 is formed in P-type silicon substrate 402 and P+ type guard ring 420 and a drain region that includes N-type impurity layer 408 and N+ type drain 410 are formed in N-type drift region 404. Field oxide layers 416 may be formed on and/or over substrate 402 and N-type drift region 404 and partially on and/over N+ type drain 410. Gate 418 may be formed on and/or over field oxide layers 416, P-type body 406 and N+ type source 412. Metal contacts 422 may be formed on and/or over substrate 402 including N+ type drain 410 and N+ type source 412

Example FIG. 4D illustrates a cross-sectional view of Schottky diode region (C-C') illustrated in example FIG. 4A and includes N-type drift region 404 formed in P-type silicon substrate 402 and P+ type guard ring 420 and a drain region that includes N-type impurity layer 408 and N+ type drain 410 formed in N-type drift region 404. Field oxide layers 416 may be formed on and/or over substrate 402 and N-type drift region 404 and partially on and/over N+ type drain 410. Gate 418 may be formed on and/or over field oxide layers 416 and N-type drift region 404. Metal contacts 422 may be formed on and/or over substrate 402 including N+ type drain 410. A contact surface of metal contact 422 and N-type drift region 404 forms the Schottky contact. The breakdown of the device due to the high voltage is allowed to be generated in the Schottky diode, and the Schottky diode performs a role of flowing a considerable amount of current instead of the body diode in a forward conducting operation region.

In accordance with embodiments, gate 418 formed in Schottky region (C-C') is shorter in width than gate 418 formed in transistor region (A-A') in order not to contact P+ type guard ring 420, and thus, prevents formation of a channel under gate 418. P+ type guard ring 420 is a structure applied in order to increase backward breakdown voltage of the Schottky diode.

In accordance with embodiments, the backward breakdown voltage of the Schottky diode may be adjusted by adjusting a width of P+ type guard ring 420 formed in Schottky diode region (C-C'). Since the Schottky diode is formed by junction of a metal and an N-type semiconductor, if the width of P+ type guard ring 420 is adjusted, a contact area of metal contact 422 formed on and/or over and between P+ type guard rings 420 and N-type drift region 404 (which is an N-type semiconductor) may also be adjusted. Therefore, the breakdown voltage may be also adjusted. The breakdown of the device may be prevented by making the backward breakdown voltage of the Schottky diode smaller than the breakdown voltage of the LDMOS voltage to allow the breakdown to be generated in the Schottky diode.

Figure 4E:
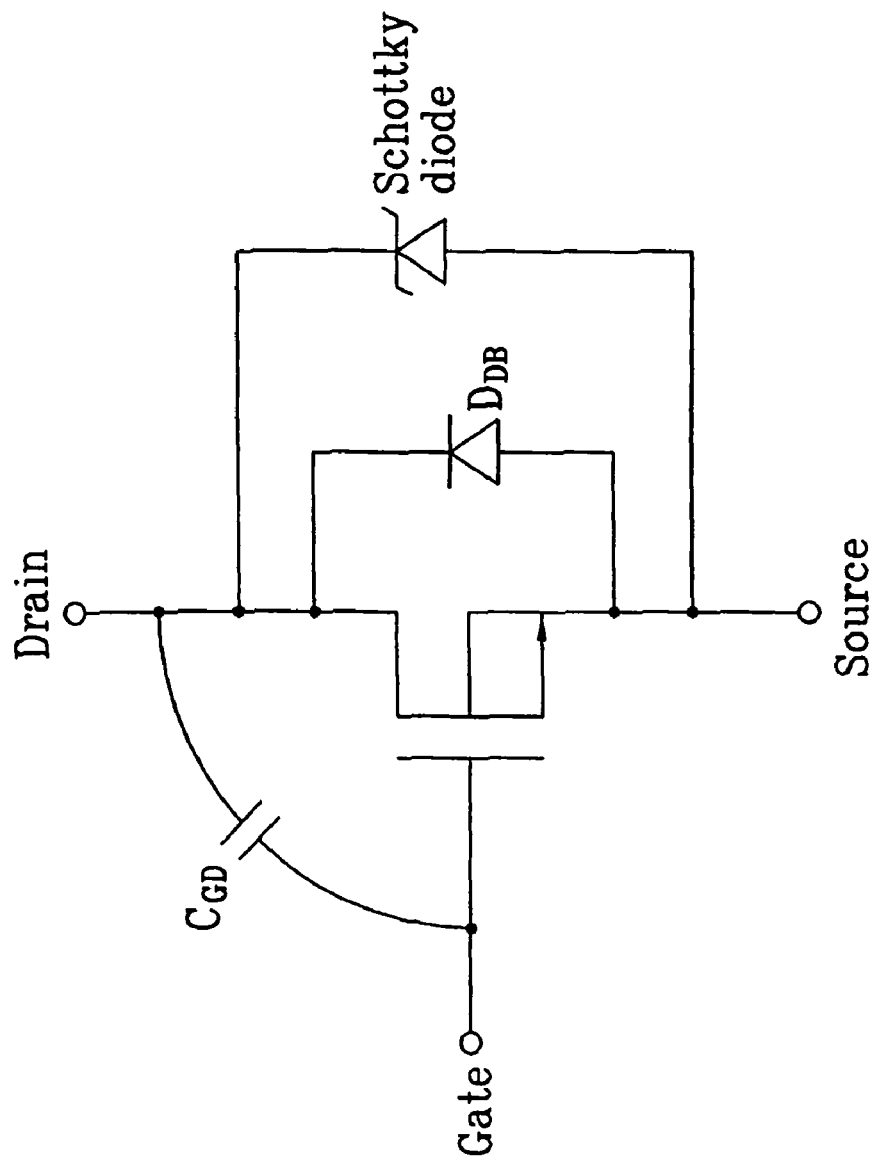

As illustrated in example FIG. 4E, a circuit diagram of the LDMOS device having a Schottky diode in accordance with embodiments and includes a transistor device, body diode DDB, parasitic capacitor CGD between a gate and a drain, and the Schottky diode. Body diode DDB may be intrinsically formed in transistor region (A-A') and body diode region (B-B'), and the Schottky diode may be formed in Schottky diode region (C-C').

Figure 5B:
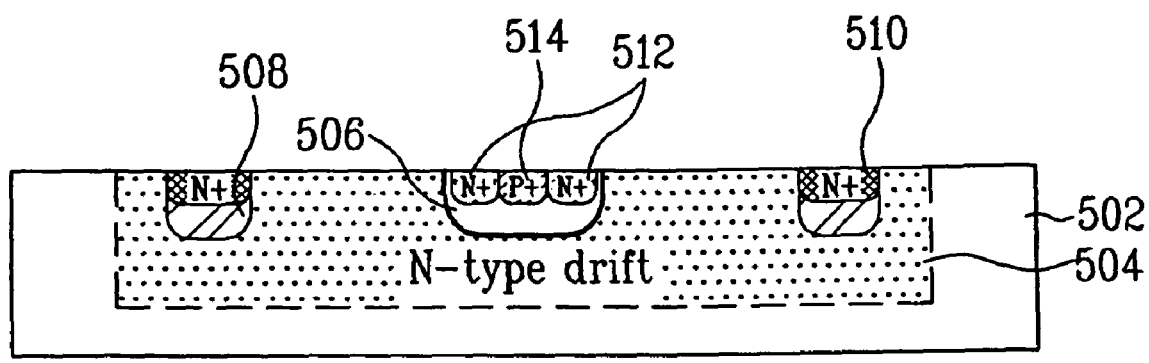
Figure 5B:
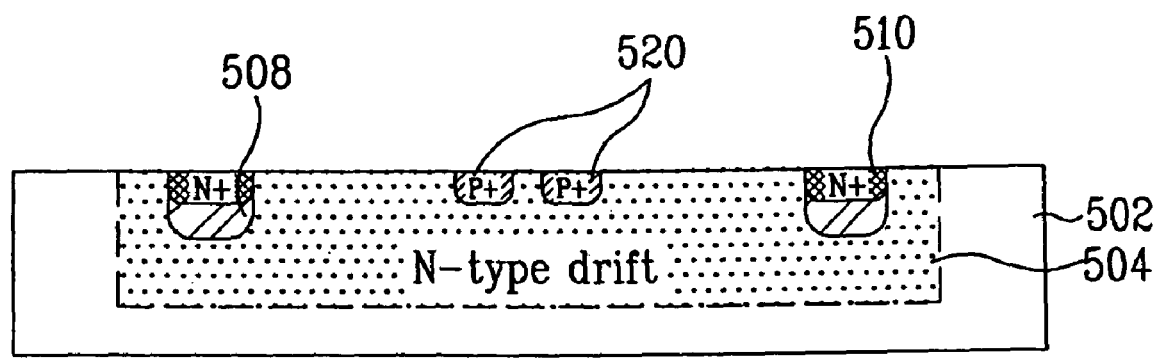
Figure 5C:
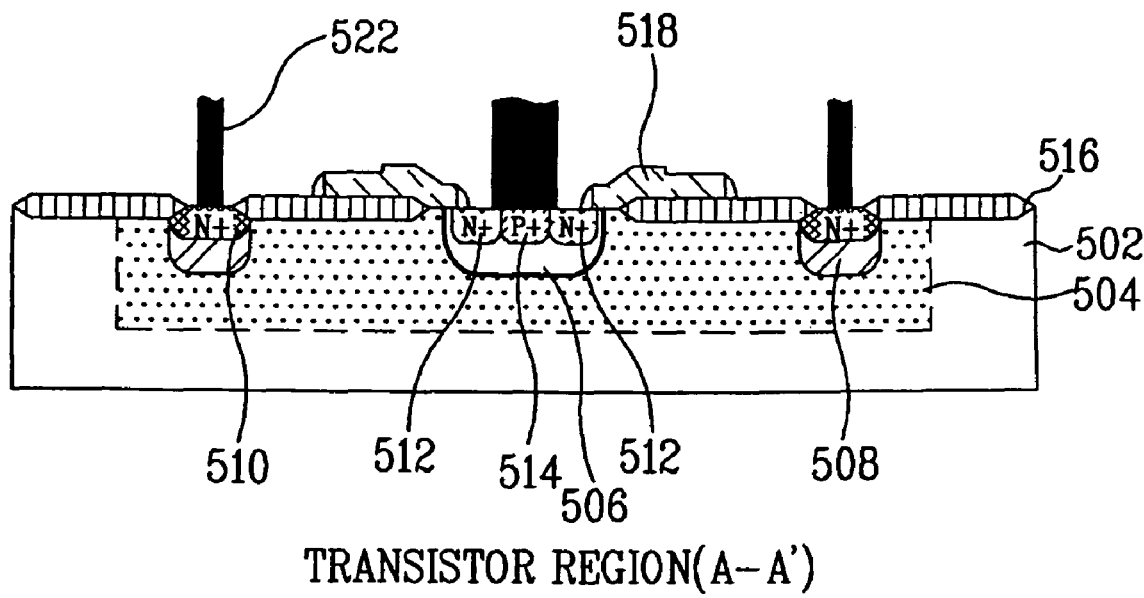
Figure 5C:
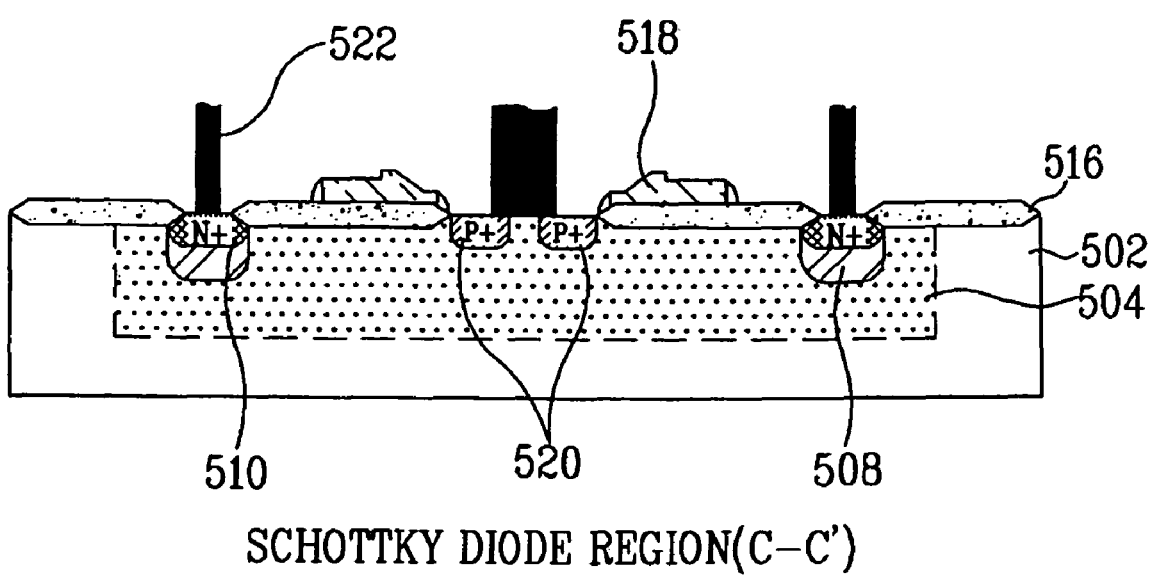

Example FIGS. 5A to 5C illustrate process flow charts of a process of fabricating a LDMOS device having a Schottky diode in accordance with embodiments.

As illustrated in example FIG. 5A, as a fabrication process common to transistor region (A-A') and Schottky diode region (C-C'), a single concentration N-type well, for example, N-type drift region 504 may be formed in P-type silicon substrate 502. Ions may then be implanted into N-drift region 504 to form a drain region that includes N-type impurity layer 508 and N+ type drain 510 such that N+ type drain 510 is formed on and/or over N-type impurity layer 508.

As illustrated in example FIG. 5B, the next fabrication process for transistor region (A-A') and the next fabrication process for Schottky diode region (C-C') will be described, respectively. The fabrication process of the transistor region (A-A') may include forming P-type body 506 in N-type drift region 504 spaced apart a predetermined distance from the formed drain region, i.e., N-type impurity layer 508 and N+ type drain 510. Preferably, P-type body 506 may be formed by implanting ions of any one of boron (B), indium (In) and gallium (Ga). P-type body 506 may be formed by performing such an ion implantation process under conditions of concentration of 1E13 to 4E14 ion/cm$^2$ and energy of 40 to 100 Kev using any one of boron (B), indium (In) and gallium (Ga). High concentration doped P+ type impurity layer 514 may then be formed in P-type body 506 to have a good contact against P-type body 506. Next, N+ type sources 512 in which impurities are implanted at a high concentration are formed adjacent to and on both sides of P+ type impurity layer 514. N+ type source 512 may be formed by ion implantation under conditions of concentration of 5E14 to 1E16 ion/cm$^2$ and energy of 20 to 100 Kev using, for example, arsenic (As).

In the next fabrication process of Schottky diode region (C-C'), P-type body 506, P+ type impurity layer 514 and N+ type source 512 are not formed, but P+ type guard rings 520 are formed in N-type drift region 504. Each respective P+ type guard ring 520 has a predetermined width, spaced by a preset interval in order to be able to adjust breakdown voltage of the Schottky diode, in addition to prevent noise generation and unnecessary channel formation.

As illustrated in example FIG. 5C, the next fabrication processes of transistor region (A-A') and Schottky diode region (C-C') will be described. After forming field oxide layers 516 on and/or over a field region for device separation and a preset region of transistor region (A-A') and Schottky diode region (C-C'), gate 518 that includes a gate insulating layer and a gate electrode is formed in a gate region. Thereafter, an interlayer dielectric layer for insulation from other conducting layer is formed and then, metal electrodes connected to N+ type source 512, N+ type drain 510, or gate 518 through contacts 522 formed on and/or over the interlayer dielectric layer are formed.

Gate 518 formed in Schottky region (C-C') is shorter in width than gate 518 formed in transistor region (A-A') in order not to contact P+ type guard ring 520. This is to prevent a channel from being formed under gate 518. A Schottky contact among contacts 522 is provided in Schottky diode region (C-C'). The Schottky contact is created by contact of a metal and N-drift region 504 which is an N-type semiconductor. Therefore, by forming P+ guard rings 520 at a preset interval, instead of P-type body 506 and N+ type source 512 when fabricating Schottky diode region (C-C') to form the Schottky diode of which breakdown voltage is adjusted, it is possible to fabricate the LDMOS device preventing device breakdown.

As described above, a lateral DMOS device for power or high voltage and a fabrication method therefor in accordance with embodiments may be fabricated to include a Schottky diode to allow breakdown of the device due to the high voltage generated in the Schottky diode, and perform a role of flowing a considerable amount of current in the Schottky diode instead of a body diode in a forward conducting operation region. Accordingly, an increase in operation speed and stability of the device may be achieved. Moreover, a lateral DMOS device may be fabricated by a BCD process, thereby making it possible to integrate the power device and prevent a phenomenon caused by operation of a parasitic bipolar transistor junction by a simple process. Also, a position and a width of the guard ring in the Schottky diode region may be adjustable to enable adjustment to the breakdown voltage of the Schottky diode.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a lateral DMOS device having a transistor region, a Schottky diode region and a field region, comprising:
    forming a second conductive type well in a first conductive type semiconductor substrate;
    forming a Schottky contact in contact with the second conductive type well in the Schottky diode region;
    forming a drain region in the second conductive type well;
    forming a first conductive type body region and in the second conductive type well and in the transistor region;
    forming a first conductive type impurity region in the first conductive type body region and forming a first conductive type guard ring in the second conductive type well in the Schottky diode region;
    forming a source region adjacent to the first conductive type impurity region;
    forming a field insulating layer in the transistor region, the Schottky diode region, and the field region; and then
    forming a gate insulating layer and a gate electrode in the transistor region and the Schottky diode region,
    wherein the Schottky contact is formed on the gate electrode, the drain region and the source region.

2. The method of fabricating a lateral DMOS device according to claim 1, wherein breakdown voltage of the Shotttky diode formed in the Shotttky diode region is adjustable by adjusting a width of the first conductive type guard ring.

3. The method of fabricating a lateral DMOS device according to claim 1, wherein the first conductive type body region is formed by implanting ions of any one of boron, indium, and gallium.

4. The method of fabricating a lateral DMOS device according to claim 3, wherein the first conductive type body region is formed by performing implanting ions at a concentration of between 1E13 to 4E14 ion/cm$^2$ and an energy level of between 40 to 100 Key.

5. The method of fabricating a lateral DMOS device according to claim 1, wherein the source region is formed by implanting ions of arsenic.

6. The method of fabricating a lateral DMOS device according to claim 5, wherein the source region is formed by implanting ions at a under conditions of concentration of between 5E14 to 1E16 ion/cm$^2$ and an energy level of between 20 to 100 Key.

7. A method of fabricating a lateral DMOS device having a transistor region, a Schottky diode region and a field region, comprising:

forming in the transistor region and the Schottky diode region an N-type drift region in a P-type silicon substrate;

forming in the transistor region and the Schottky diode region a drain region in the N-type drift region including an N-type impurity layer and an N+ type drain formed on the N-type impurity layer;

forming in the transistor region a P-type body in the N-type drift region spaced apart from the drain region;

forming in the transistor region a high concentration doped P+ type impurity layer in the P-type body and high concentration doped N+ type sources surrounding the P+ type impurity layer;

forming in the Schottky diode region P+ type guard rings in the N-type drift region;

forming field oxide layers in the transistor region, the Schottky diode region and the field region;

forming a gate in the transistor region and the Schottky diode region; and then forming in the Schottky diode region a contact in contact with the N-type drift region.

8. The method of fabricating a lateral DMOS device according to claim 7, wherein the N+ type source are formed by implanting ions of any one of boron, indium and gallium at a concentration of between 1E13 to 4E14 ion/cm$^2$ and an energy level of between 40 to 100 Kev.

9. The method of fabricating a lateral DMOS device according to claim 7, wherein the N+ type source are formed by implanting ions of arsenic at a concentration of between 5E14 to 1E16 ion/cm$^2$ and an energy level of between 20 to 100 Kev.

10. The method of fabricating a lateral DMOS device according to claim 7, wherein the P+ type guard rings are formed having a predetermined width and are spaced apart by a predetermined interval.

11. The method of fabricating a lateral DMOS device according to claim 7, wherein the gate formed in the Schottky region is shorter in width than the gate formed in the transistor region in order not to contact the P+ type guard rings.

12. The method of fabricating a lateral DMOS device according to claim 7, wherein the Schottky contact comprises a metal contact.

* * * * *